United States Patent [19]
Ramdani et al.

[11] Patent Number: 6,008,067
[45] Date of Patent: Dec. 28, 1999

[54] FABRICATION OF VISIBLE WAVELENGTH VERTICAL CAVITY SURFACE EMITTING LASER

[75] Inventors: Jamal Ramdani, Gilbert; Michael S. Lebby, Apache Junction; Wenbin Jiang, Phoenix, all of Ariz.

[73] Assignee: Motorola, Inc., Schaumburg, Ill.

[21] Appl. No.: 09/034,485

[22] Filed: Mar. 4, 1998

Related U.S. Application Data

[62] Division of application No. 08/775,053, Dec. 27, 1996, abandoned.

[51] Int. Cl.$^6$ ............................................. H01S 3/02
[52] U.S. Cl. .................................. 438/46; 438/31; 372/43
[58] Field of Search ............................ 438/22, 31, 32, 438/46, 47; 372/43, 45, 46

[56] References Cited

U.S. PATENT DOCUMENTS 5,331,656 7/1994 Tanaka .
5,351,256 9/1994 Schneider et al. .

OTHER PUBLICATIONS

R.P. Schneider et al., "MOVPE growth of InAlGaP–based visible vertical–cavity surface–emitting lasers", Journal of Crystal Growth 124, pp. 763–771 (no month given), 1992.

*Primary Examiner*—Charles Bowers
*Assistant Examiner*—Keith Christianson
*Attorney, Agent, or Firm*—Eugene A. Parsons; William E. Koch

[57] ABSTRACT

A VCSEL for emitting visible wavelength light including a GaInP substrate element, a first mirror stack with mirror pairs in a GaInP/AlInP material system lattice matched to a GaInP active region. The active region including a quantum well layer, a first barrier layer and a second barrier layer. The active region sandwiched between a first cladding region adjacent the first mirror stack and a second cladding region adjacent a second mirror stack. The second mirror stack lattice matched to the active region and having mirror pairs in a GaInP/AlInP material system. The VCSEL device capable of emitting light in the range of 635–650 nanometers.

7 Claims, 1 Drawing Sheet

FABRICATION OF VISIBLE WAVELENGTH VERTICAL CAVITY SURFACE EMITTING LASER

This application is a divisional of Ser. No. 08/775,053 filed Dec. 27, 1996, abandoned.

FIELD OF THE INVENTION

This invention relates to vertical cavity surface emitting lasers and more specifically to vertical cavity surface emitting lasers for emitting visible wavelength light.

BACKGROUND OF THE INVENTION

Vertical cavity surface emitting lasers (VCSEL) typically include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses a GaInP/AlInP, an AlAs/GaAs or an AlGaAs/AlAs material system wherein the different refractive index of each layer of a pair is achieved by altering the aluminum material content in the layers. As an example, in a VCSEL that uses a GaAs substrate and the GaInP/AlInP material system, the emission wavelength is limited to 670 nm or longer. The best results are achieved in the 675–690 nm range, due to poor electrical and optical confinement between the GaInP multiple quantum wells (MQWs) and the AlInP cladding layers used in the active region. In conventional devices of this type, the number of mirror pairs per stack may range from 30–55 to achieve a high percentage of reflectivity, depending on the difference between the refractive indices of the layers. The large number of pairs increases the percentage of reflected light.

In conventional VCSELs, conventional material systems perform adequately. However, new products are being developed requiring VCSELs which emit light having visible wavelengths. VCSELs emitting light having a visible wavelength are of great interest in the digital video disk (DVD) industry, more particularly for use with both audio and CD-ROM applications. Accordingly, it would be highly advantageous, to remedy the foregoing problems and other deficiencies inherent in the prior art.

Therefore, it is an object of the present invention to provide a new and improved visible wavelength VCSEL and method of fabrication. Typically, the DVD standard requires an emission in the 635–650 nm range, a power of 3 mW–5 mW for a read only mode of operation, 30 mw for a write only mode of operation, and an operating temperature of up to 60° C. These visible wavelengths can be obtained by using a VCSEL having a strained GaInP quantum well layer and AlGaInP barrier layers which compose the active region, AlInP cladding layers and GaInP/AlInP distributed Bragg reflectors with a GaInP substrate element. In a device of this type, the total bandgap discontinuity is approximately 400 meV, which is large enough to allow for excellent electrical confinement, thus allowing for operation at high temperatures with good reliability. In addition, the distributed Bragg reflectors can be easily formed using alternating layers of GaInP and AlInP layers lattice matched to the GaInP substrate. The refractive index difference between the two layers is approximately 0.5 at 650 nm and a forty pair DBR structure will allow for an approximate 99.99% power reflectance.

Another object of the invention is to provide a reliable visible wavelength VCSEL.

It is yet a further object of the present invention to provide for a new and improved active region for use in a visible wavelength VCSEL.

Another object of the invention is to provide a new and improved substrate element for use in a visible wavelength VCSEL.

Still another object of the present invention is to provide for an efficient active region and mirror stacks for use in a visible wavelength VCSEL.

Yet another object of the invention is to reduce the complexity of fabricating a visible wavelength VCSEL.

Another object of the present invention is to provide an active region which emits visible wavelength light, a mirror stack and substrate which can be lattice matched thereto.

SUMMARY OF THE INVENTION

Briefly, to achieve the desired objects of the instant invention in accordance with a preferred embodiment thereof, provided is a VCSEL for emitting visible wavelength light. The VCSEL includes a GaInP substrate element, a first mirror stack disposed on the GaInP substrate element, a AlInP cladding layer disposed on the mirror stack, a GaInP active region with a quantum well layer disposed on the first cladding region, a second cladding region disposed on the active region, and a second mirror stack disposed on the second cladding region.

In a preferred embodiment the active region and the first and the second mirror stacks are configured to emit light with a wavelength in a range of approximately 635–650 nm. The quantum well is configured with a direct energy band-gap of approximately 1.9 eV and includes GaInP.

Also provided is a method of fabricating a VCSEL for emitting visible wavelength light. The method includes providing a substrate of GaInP having a surface, epitaxially growing a first mirror stack on the surface, epitaxially growing a cladding layer, and an active region with a quantum well including GaInP on the first mirror stack, and epitaxially growing a second cladding layer and second mirror stack on the active region.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENT

Figure 1:
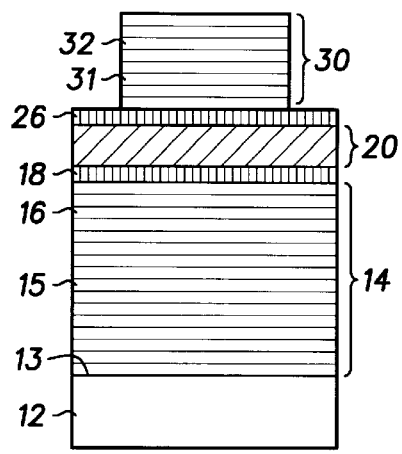
FIG. 1 is a sectional view of a VCSEL in accordance with the present invention.

Turning now to the drawings in which like reference characters indicate corresponding elements throughout the several views, attention is first directed to FIG. 1 which illustrates a visible wavelength vertical cavity surface emitting laser (VCSEL) generally designated 10. VCSEL 10 is formed on a substrate 12, which in this specific embodiment, is GaInP. GaInP is preferably used to facilitate epitaxial growth and achieve lattice match of the components of VCSEL 10 which emits light in a visible wavelength approximately in the range of 635–650 nm. It should be understood that GaInP is only utilized as an example and other semiconductor materials may be employed as substrate 12. Substrate 12 is fabricated by adding indium (In) to a standard GaP substrate. More specifically, substrate 12 is fabricated by adding In to a level of approximately 25% of the total mole fraction of a GaP substrate.

Figure 2:
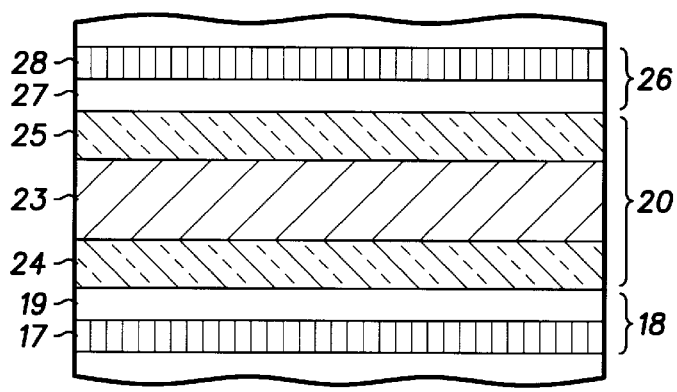
FIG. 2 is a sectional view of the active regions of a VCSEL in accordance with the present invention.

Substrate 12 has an upper surface 13 on which a n-type mirror stack 14 is disposed. Mirror stack 14 includes a plurality of mirror pairs in a AlInP/GaInP material system. More particularly, illustrated is the plurality of mirror pairs composed of alternating layers which include a plurality of layers of an AlInP material 15 and a plurality of layers of a GaInP material 16. As illustrated in FIGS. 1 and 2, a first cladding region 18 is disposed adjacent first mirror stack 14 and includes an InAlP material, more particularly $In_{.25}Al_{.75}P$. An active region 20 is disposed on first cladding region 18. Active region 20 includes at least one quantum well layer 23 sandwiched between a first barrier layer 24 and a second barrier layer 25. A second cladding region 26 is disposed on second barrier layer 25 and includes an InAlP material. A second mirror stack 30 is disposed on second cladding region 26 and includes mirror pairs in an AlInP/GaInP material system, or alternatively second mirror stack 30 is made of a dielectric mirror stack and includes pairs of alternating layers in an oxide based material system, such as alternating layers of a $SiO_2$ material and a ZnO material.

Mirror stack 14 is grown by epitaxially depositing pairs of layers on substrate 12. In order to crystal lattice match mirror stack 14 to substrate 12 a suitable semiconductor material system must be deposited. In this specific example, substrate 12 is composed of GaInP and, therefore, mirror stack 14 employs a GaInP/AlInP material system. Approximately 20–50 mirror pairs of this material system are deposited on substrate 12 depending on the difference between the refractive indices of the layers, which in this particular embodiment is approximately 0.5 at 650 nm. The large number of pairs increases the percentage of reflected light, and in this particular embodiment with 40 pairs of alternating layers an approximate 99.99% power reflectance is achieved.

Illustrated in greater detail in FIG. 2 is active region 20 sandwiched therebetween cladding regions 18 and 26. As illustrated, cladding region 18, configured with a direct energy bandgap of approximately 2.3 eV, includes one or more layers which may be graded if necessary to lattice match mirror stack 14 to active region 20. In this specific embodiment, cladding region 18 is formed of an AlInP material system. For example cladding region 18 includes a first layer 17 formed of n-type $Al_{.75}In_{.25}P$ to lattice match mirror stack 14, and a second layer 19 formed of a material having an energy gradient for better carrier confinement in active region 20.

Figure 3:
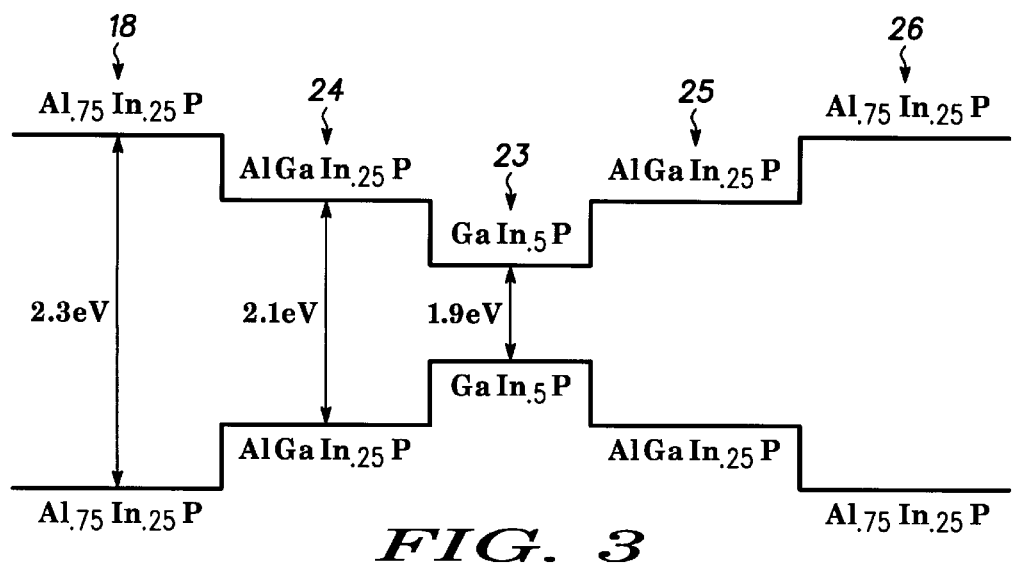
FIG. 3 is a graphical representation of a direct energy band-gap versus material in the active region of the VCSEL of FIG. 1 in accordance with the present invention.

Active region 20, in this embodiment, includes one quantum well layer 23 separated by barrier layers 24 and 25. For example quantum well layer 23 and barrier layers 24 and 25 are each approximately 100Å and the total thickness of active region 20 and cladding regions 18 and 26 is one wavelength of the emitted light or a multiple thereof. Quantum well layer 23 is formed of strained GaInP, having an approximate 1% compressive strain, thereby achieving a high gain and low threshold current. One skilled in the art will understand that more quantum well layers and barrier layers can be used depending upon the application. Barrier layers 24 and 25 are formed of a AlGaInP material system, more particularly $(Al_xGa_{1-x})_{.75}In_{.25}P$ configured with a direct energy bandgap of approximately 2.1 eV. Active region 20 and first and second mirror stacks 14 and 30 respectively are configured to emit light with a wavelength in a range of approximately 635–650 nanometers. To achieve this range quantum well layer 23 is configured with a direct energy bandgap of approximately 1.9 eV. A graphical representation of the direct energy bandgap versus material in active region 20 of VCSEL 10 is illustrated in FIG. 3. In this particular embodiment, the total bandgap discontinuity is approximately 400 meV, sufficient to allow for good electrical confinement, thus operation at high temperatures with good reliability.

Cladding region 26 includes one or more layers which may be graded if necessary for better carrier confinement in active region 20. In this specific embodiment, cladding region 26 is formed of an AlInP material system. For example cladding region 26 includes a first layer 28 formed of AlInP to lattice match mirror stack 30, and a second layer 27 formed of a material having a energy gradient for better carrier confinement in active region 20.

Mirror stack 30 is grown by epitaxially depositing pairs of layers on cladding region 26. In order to crystal lattice match mirror stack 30 to active region 20, a suitable semiconductor material system must be deposited. In this specific example, cladding region 26 is AlInP based and, therefore mirror stack 30 employs a GaInP/AlInP material system, more particularly a plurality of alternating layers of a GaInP material 31 and an AlInP material 32. Approximately 20–40 mirror pairs of this material system are deposited on cladding region 26 depending on the difference between the refractive indices of the layers. The different refractive index of the layers of each pair is achieved by altering the aluminum to gallium ratio. The large number of pairs increases the percentage of reflected light.

Generally, doping of stacks 14 and 30 of distributed Bragg reflectors is split, with one of the stacks being N-type and the other being P-type. Any suitable N-type dopants, such as silicon, selenium, or the like and P-type dopants, such as carbon, zinc, magnesium or the like can be use to dope portions of VCSEL 10. Since doping levels are well known in the art, the doping levels will not be described herein other than to identify material either as undoped, P-type doped, or N-type doped. Briefly, stack 14 of distributed Bragg reflectors and layer 17 of cladding region 18 are N-type doped with stack 30 of distributed Bragg reflectors, layer 28 of cladding region 26 being P-typed doped. Layers 19 and 27 of cladding regions 18 and 26, respectively, and active area 20 are undoped.

In the present invention, it should be understood that the alternating layers 15 and 16 and the alternating layers 31 and 32 are formed such that alternating layers 15 and 16 have differing refractive indexes and that alternating layers 31 and 32 also differ in their refractive indexes. However, generally, stacks 14 and 30 of distributed Bragg reflectors are based on the same materials. Additionally, it should be understood that in the examples contained within this description where a percent composition of a particular element is given it should be considered only as an example. It should be further understood that variations from these examples can be large and are part of the present invention.

To complete VCSEL 10, a contact layer (not shown) is positioned on mirror stack 30, and a contact layer (not shown) is positioned on substrate 12, for example on the rear surface thereof. As will be understood by those skilled in the art the contact layers positioned on mirror stack 30 is so constructed as to permit the emission of light from VCSEL 10.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. For example, it should be understood that VCSEL structure symmetry exists for both the p and n dopants as well as electrically inverted structure designs. We desire it to be understood, therefore, that this invention is not limited to the particular forms shown and we intend in the appended claims to cover all modifications that do not depart from the spirit and scope of this invention.

What is claimed is:

1. A method of fabricating a vertical cavity surface emitting laser for emitting visible wavelength light, the method comprising the steps of:

providing a $Ga_xIn_{1-x}P$ substrate having a surface, wherein x is approximately 0.75;

epitaxially growing a first mirror stack on the surface;

epitaxially growing a first cladding region on the first mirror stack;

epitaxially growing a $Ga_xIn_{1-x}P$ active region with a quantum well on the first cladding region, wherein $0 \leq x \leq 1$;

epitaxially growing a second cladding region on the $Ga_xIn_{1-x}P$ active region; and epitaxially growing a second mirror stack on the second cladding region.

2. A method of fabricating a vertical cavity surface emitting laser for emitting visible wavelength light as claimed in claim 1 wherein the step of epitaxially growing a $Ga_xIn_{1-x}P$ active region includes epitaxially growing the quantum well to include $Ga_{0.5}In_{0.5}P$.

3. A method of fabricating a vertical cavity surface emitting laser for emitting visible wavelength light as claimed in claim 1 wherein the step of epitaxially growing a $Ga_xIn_{1-x}P$ active region includes epitaxially growing a plurality of barrier layers including $(Al_xGa_{1-x})_{.75}In_{.25}P$, where x is in a range of 50–100%.

4. A method of fabricating a vertical cavity surface emitting laser for emitting visible wavelength light as claimed in claim 1 wherein the step of epitaxially growing a GaInP active region includes epitaxially growing a plurality of cladding layers including $Al_{.75}In_{.25}P$.

5. A method of fabricating a vertical cavity surface emitting laser for emitting visible wavelength light as claimed in claim 1 wherein the step of epitaxially growing a first mirror stack and a second mirror stack includes epitaxially growing alternating layers to include AlInP and GaInP.

6. A method of fabricating a vertical cavity surface emitting laser for emitting visible wavelength light, the method comprising the steps of:

providing a $Ga_xIn_{1-x}P$ substrate having a surface, wherein x is approximately 0.75;

epitaxially growing a first plurality of mirror pairs in a $Ga_xIn_{1-x}P/Al_xIn_{1-x}P$ material system forming a first mirror stack on the surface, lattice matched to the substrate, wherein $0 \leq x \leq 1$;

epitaxially growing a first cladding region including an $Al_xIn_{1-x}P$ material system on the first mirror stack;

epitaxially growing a GaInP active region including a quantum well layer sandwiched between a first barrier layer lattice matched to the first mirror stack and a second barrier layer;

epitaxially growing a second plurality of mirror pairs in a $Ga_xIn_{1-x}P/Al_xIn_{1-x}P$ material system forming a second mirror stack lattice matched to the active region.

7. A method of fabricating a vertical cavity surface emitting laser for emitting visible wavelength light as claimed in claim 6 wherein the step of epitaxially growing a $Ga_xIn_{1-x}P$ active region includes epitaxially growing the quantum well layer to include $Ga_{0.5}In_{0.5}P$.

* * * * *